US006747405B2

(12) United States Patent
Hosokawa

(10) Patent No.: US 6,747,405 B2
(45) Date of Patent: Jun. 8, 2004

(54) ORGANIC EL DISPLAY DEVICE HAVING CONDUCTIVE COLOR CHANGING LAYERS

(75) Inventor: Chishio Hosokawa, Sodegaura (JP)

(73) Assignee: Demitsu Kosan Co., Ltd. (JP)

( * ) Notice: Subject to any disclaimer, the term of this patent is extended or adjusted under 35 U.S.C. 154(b) by 140 days.

(21) Appl. No.: 09/994,710

(22) Filed: Nov. 28, 2001

(65) Prior Publication Data

US 2002/0063517 A1 May 30, 2002

(30) Foreign Application Priority Data

Nov. 28, 2000 (JP) ........................................ 2000-360894

(51) Int. Cl.$^7$ ................................................ H05B 33/00
(52) U.S. Cl. ........................ 313/504; 313/506; 313/112
(58) Field of Search ............................... 313/503–512, 313/112, 110, 498, 500, 113; 428/690

(56) References Cited

FOREIGN PATENT DOCUMENTS

WO          WO98/34437          8/1998

OTHER PUBLICATIONS

C.W. Tang et al, "Organic Electroluminescent Diodes," Appl. Phys. Lett. 51 (12), Sep. 21, 1987, pp. 913–915.

*Primary Examiner*—Vip Patel
*Assistant Examiner*—Joseph Williams
(74) *Attorney, Agent, or Firm*—Parkhurst & Wendel, L.L.P.

(57) ABSTRACT

An organic EL display device including first electrodes and second electrodes to which a voltage is applied; conductive color changing layers capable of being electrically connected to the first electrodes; and an organic luminescent medium placed between the second electrodes and the color changing layers. When a voltage is applied between the first and second electrodes, an electric field is generated between the second electrodes and the color changing layers in contact with the first electrodes. As a result, the organic luminescent medium emits light therebetween. Because no or little light interference exists between the first and second electrodes, chromaticity does not change even if a viewing angle is changed. Because the color changing layers can be placed in contact with or very close to the organic luminescent medium, a color mixture due to changes in viewing angle hardly occurs.

15 Claims, 6 Drawing Sheets

ORGANIC EL DISPLAY DEVICE HAVING CONDUCTIVE COLOR CHANGING LAYERS

BACKGROUND OF THE INVENTION

1. Field of the Invention

The present invention relates to an organic EL display device, in which an organic luminescent medium emits light by applying electric field thereto and color changing layers decompose and convert the light, and a method of manufacturing the organic EL display device. More particularly, the present invention relates to an organic EL display device suitably employed in display apparatuses for personal and industrial uses and the like.

2. Description of the Related Art

An organic electroluminescent (hereinafter referred to as EL) element is a natural luminescent element, which uses the principle that upon applying electric field, positively charged holes (hereinafter referred to as positive holes) injected from an anode recombine electrons injected from a cathode, and an organic luminescent medium emits light by using the combination energy.

Since C. W. Tang et al. reported an organic EL element device driven at low voltages, for example, "Applied Physics Letters", 51(12), 913, 1987, much research has been done on organic EL elements made of organic materials. Chelate complexes such as tris(8-quinolinolate)aluminum and the like, coumarin derivatives, tetraphenylbutadiene derivatives, bisstyrylarylene derivatives, oxadiazole derivatives and the like have been known as a luminescent material. It has been reported that they allow luminescence in the visible range form blue to red, thereby attempting the realization of a color display element.

FIG. 14 is a sectional view showing a conventional organic EL color display device.

As shown in FIG. 14, a color filter 213 is provided on a substrate 210. In the color filter 213, a plurality of color changing layers 214 are separately arranged in the order of red (R), green (G) and blue (B). Under electrodes 211 are formed in a striped pattern on the top surface of the color filter 213 along the color changing layers 214.

Upper electrodes 212 are formed in a striped pattern so as to be opposed to the under electrodes 211. An organic luminescent medium 215 is provided between the under electrodes 211 and upper electrodes 212, which medium 215 emits light when electric field is applied to the medium. In the organic luminescent medium 215, organic luminescent medium layers 215a, 215b, 215c are separately arranged so as to be substantially in a plane. The layers 215a, 215b, 215c can emit lights of three colors, R, G, B.

The layers 215a, 215b, 215c are arranged above the color changing layers 214 through the under electrodes 211 for each color so that the positions thereof coincide with those of the R, G, B color changing layers 214.

The color changing layers 214 change light to three colors, R, G, B. They enhance the color purity of the organic luminescent medium and further suppress reflection of outer light on the upper electrodes 212 and the like.

The three color organic luminescent medium layers are formed on a substrate with a mask by deposition. The low precision of positioning the mask may result in color mixture. Thus, the cost for manufacturing a highly precise display device is extremely high. Further, a pair of electrodes occur light interference. If a viewing angle changes, chromaticity changes due to the light interference.

WO98/34437 (U.S. Ser. No. 09/147,104) discloses an organic EL display device as shown in FIG. 15. In the organic EL display device, organic luminescent mediums 225 emitting mono-color light, white or blue, is placed between under electrodes 221 and upper electrodes 222; shading members 226 are interposed between color changing layers 224; and a light-transmitting medium 228 are provided between the organic luminescent mediums 225 and the color changing layers 224. The relationship $d2 \geq d1$ is satisfied wherein d1 represents a distance between the color changing layers 224 and the organic luminescent mediums 225, and d2 represents the width of the shading members 226.

In this organic EL display device, since the organic luminescent mediums 225 emitting mono-color light are used, the very high precision of positioning the layers 225 are not required. Further, since the above relationship $d2 \geq d1$ is satisfied, color mixture hardly occur, thereby improving the quality of display images.

However, the distance d1 defined by the thickness of the light-transmitting medium 228 is inevitably larger than zero. Thus, even the invention of WO98/34437 has a limitation in the precision of display and it is difficult to obtain display with high precision. Further, it is difficult that d1 is decreased to several micro meters or less, leading to high cost.

Moreover, even in the invention of WO98/34437, if a viewing angle changes, chromaticity inadvantageously changes due to light interference caused by a pair of electrodes 221, 222. In particular, since color filters are used in blue pixels when blue luminescent medium is used as an organic luminescent medium, changes in chromaticity due to light interference cannot be compensated against blue light.

SUMMARY OF THE INVENTION

An object of the present invention is therefore to provide an organic EL display device in which color mixture hardly occurs and chromaticity does not change even if a viewing angle is changed, and a manufacturing method thereof.

According to a first aspect of the present invention, there is provided an organic EL display device comprising: first electrodes and second electrodes which a voltage is applied to; conductive color changing layers capable of being electrically connected to the first electrodes; and an organic luminescent medium placed between the second electrodes and the color changing layers.

In the device of the present invention, the first electrodes, the color changing layers, the organic luminescent medium and the second electrodes may be placed in this order, and the width of the color changing layers may be substantially the same as that of the first electrodes.

Further, the first electrodes may contact the color changing layers, and the width of the first electrodes may be narrower than that of the color changing layers.

In the device of the present invention, when a voltage is applied between the first and second electrodes, electric field is generated between the second electrodes and the color changing layers in contact with the first electrodes. As a result, the organic luminescent medium emits light therebetween.

In the device of the present invention, the color changing layers may directly contact the organic luminescent medium. Alternatively, another layer such as a flattening layer may be interposed between the color changing layers and the organic luminescent medium.

Further, the first electrodes may contact the color changing layers directly or through switching elements.

The color changing layers may comprise color filters, fluorescent layers or combination thereof. The organic luminescent medium may be of mono-color emission or three-color emission type.

In the device of the present invention, since no or little light interference exists between the first and second electrodes, chromaticity does not change even if a viewing angle is changed.

Moreover, since the light from the organic luminescent medium is not or hardly obstructed by the first electrodes with a high refractive index, luminous efficiency can be enhanced.

Since the color changing layers can be placed in contact with or very close to the organic luminescent medium, color mixture due to changes in viewing angle hardly occurs.

According to a second aspect of the present invention, there is provided a method of manufacturing an organic EL display device comprising; forming conductive color changing layers and first electrodes, the color changing layers capable of being electrically connected to the first electrodes; forming an organic luminescent medium above the color changing layers; and forming second electrodes to sandwich the organic luminescent medium between the second electrodes and the color changing layers, a voltage being applied to the first and second electrodes.

Preferably, the first electrodes and the color changing layers are patterned by an etching method.

Preferably, the color changing layers are formed on the first electrodes by a micelle electrolytic method.

The present invention can be applied to organic EL display devices of bottom emission type where light is taken from a substrate or top emission type where light is taken from the direction opposite to the substrate.

DESCRIPTION OF THE PREFERRED EMBODIMENTS

Preferred embodiments of the present invention will be explained with reference to the drawings.

First Embodiment

Figure 1:
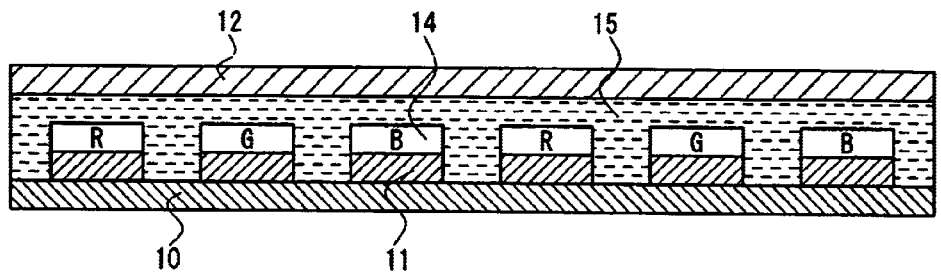
FIG. 1 is a sectional view of an organic EL display device according to a first embodiment of the present invention, illustrating the structure thereof.

FIG. 1 is a sectional view of an organic EL display device according to a first embodiment of the present invention, illustrating the structure thereof.

As shown in FIG. 1, an organic EL display device of the embodiment comprises under electrodes 11 formed on a substrate 10, color changing layers 14 on the under electrodes 11, upper electrodes 12 opposite to the under electrodes 11 and an organic luminescent medium 15 formed between the under electrodes 11 and color changing layers 14. The color changing layers 14 are made of a conductive material.

The under electrodes 11 and upper electrodes 12 are constructed by arranging linear transparent electrodes in a striped pattern so that each under electrode 11 is perpendicular to each upper electrode 12.

The color changing layers 14 of three colors, R, G, B, are sequentially separately formed on the under electrodes 11. The layers 14 are repeatedly formed substantially in a plane. The width of the layers 14 is substantially the same as that of the first electrodes 11. The organic luminescent medium 15 is provided in contact with the layers 14.

Thus, when applying voltage between the under electrodes 11 and the upper electrodes 12, electric field is generated between the conductive color changing layers 14 and the upper electrodes 12, allowing the luminescence of the organic luminescent medium 15 contacting the layers 14.

In this embodiment, since the organic luminescent medium 15 directly contacts the color changing layers 14, even if the color changing layers 14 are not positioned with high precision, color mixture caused by the position change of color changing layers does not occur. Further, since the color changing layers 14 are interposed between the upper electrodes 12 and under electrodes 11, the interference of the electrodes 11, 12 is reduced, thereby suppressing changes in chromaticity with changes in viewing angle.

In this embodiment and the later embodiments, a plurality of organic luminescent mediums for emitting three colors, R, G, B, light may be separately arranged, or a single organic luminescent medium for emitting a single color light, e.g., white or blue, may be arranged. In this case of the single organic luminescent medium, since precise positioning is not required and the entire structure of the organic EL display device can be simplified, the organic EL display device can be easily manufactured at low cost.

The conductive color changing layers 14, electrodes 11, 12 and organic luminescent medium 15 constituting the organic EL display device will be described in detail later.

Second Embodiment

Figure 2:
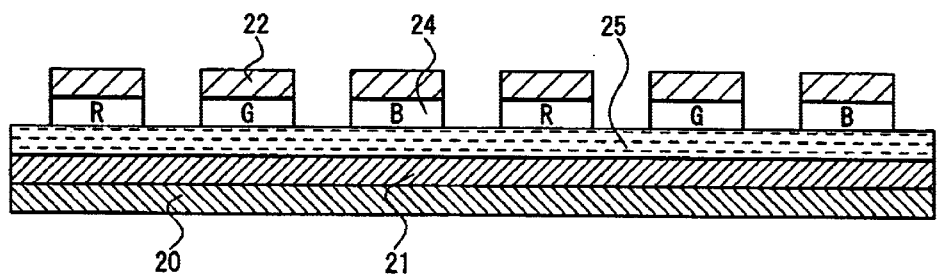
FIG. 2 is a sectional view of an organic EL display device according to a second embodiment of the present invention, illustrating the structure thereof.

FIG. 2 is a sectional view of an organic EL display device according to a second embodiment of the present invention, illustrating the structure thereof.

As shown in FIG. 2, an organic EL display device of the embodiment comprises under electrodes 21 formed on a substrate 20, upper electrodes 22 opposite to the under electrodes 21, conductive color changing layers 24 on the upper electrodes 22 at the side facing the under electrodes 21, and an organic luminescent medium 25 formed between the under electrodes 21 and color changing layers 24.

Like the above embodiment, the R, G, B, color changing layers 24 are sequentially separately repeatedly formed substantially in a plane. The organic luminescent medium 25 is provided in contact with the layers 24.

Like the above embodiment, when electric field is generated between the under electrodes 21 and the upper electrodes 22, a potential difference is produced between conductive color changing layers 24 and the under electrodes 21, allowing the luminescence of the organic luminescent medium 25 contacting the layers 24.

Even if the color changing layers 24 are not positioned with high precision color mixture caused by changes in viewing angle does not occur. Further, since the color changing layers 24 are interposed between the upper electrodes 22 and under electrodes 21, the interference of the electrodes 21, 22 is reduced, thereby suppressing changes in chromaticity with changes in viewing angle.

Third Embodiment

Figure 3:
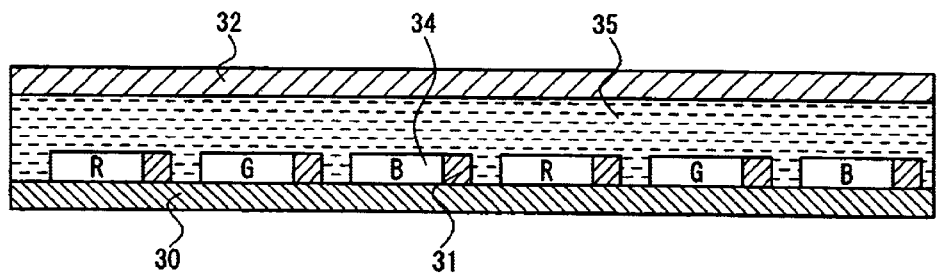
FIG. 3 is a sectional view of an organic EL display device according to a third embodiment of the present invention, illustrating the structure thereof.

FIG. 3 is a sectional view of an organic EL display device according to a third embodiment of the present invention, illustrating the structure thereof.

As shown in FIG. 3, an organic EL display device of the embodiment comprises under electrodes 31 formed on a substrate 30, color changing layers 34 formed at an end of the under electrodes 31, upper electrodes 32 opposite to the under electrodes 31 and color changing layers 34, and an organic luminescent medium 35 formed between the upper electrodes 32 and color changing layers 34. The color changing layers 34 are made of a conductive material.

The R, G, B, color changing layers 34 are sequentially separately repeatedly formed substantially in a plane. The organic luminescent medium 35 is provided in contact with the layers 34.

The width of the under electrodes 31 is narrower than that of the color changing layers 34. The electrodes 31 and the layers 34 are formed in the same plane without any overlap.

According to the embodiment, the color changing layers 34 are conductive in electrical connection with the under electrodes 31. Thus, if a voltage is applied between the upper electrodes 32 and the under electrodes 31, electric field is generated between the color changing layers 34 and the upper electrodes 32, allowing the luminescence of the organic luminescent medium 35 therebetween.

The width of the under electrodes 31 can be extremely narrower, compared with that of the color changing layers 34 and the under electrodes 31 can be made of fine metal wire through which light does not transmit.

Since fine metal wire with a low electric resistance is used in the under electrodes 31, luminous efficiency can be improved. As a result, there can be provided an organic EL display device with high luminous brightness but low power consumption.

Fourth Embodiment

Figure 4:
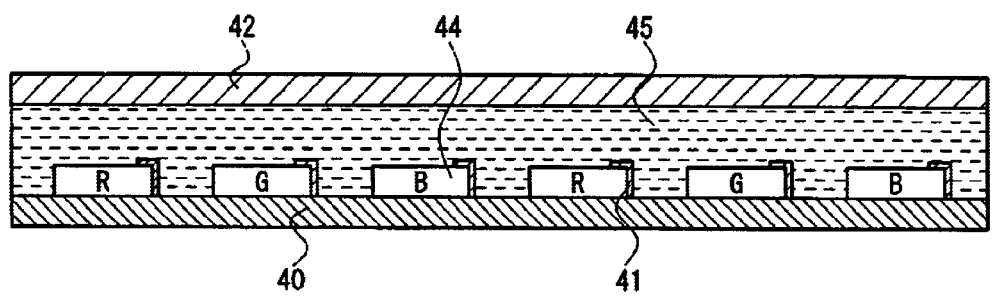
FIG. 4 is a sectional view of an organic EL display device according to a fourth embodiment of the present invention, illustrating the structure thereof.

FIG. 4 is a sectional view of an organic EL display device according to a fourth embodiment of the present invention, illustrating the structure thereof.

As shown in FIG. 4, an organic EL display device of the embodiment comprises color changing layers 44 formed on a substrate 40, under electrodes 41 formed in contact with a side of the color changing layers 44 with a part of the electrodes 41 extending from the side onto the top surface of the color changing layers 44, upper electrodes 42 opposite to the under electrodes 41 and color changing layers 44, and an organic luminescent medium 45 formed between the upper electrodes 42 and color changing layers 44. The color changing layers 44 are made of a conductive material.

The R, G, B, color changing layers 44 are sequentially separately repeatedly formed substantially in a plane. The organic luminescent medium 45 is provided in contact with the layers 44.

According to the embodiment, the color changing layers 44 are conductive in electrical connection with the under electrodes 41. Thus, if a voltage is applied between the upper electrodes 42 and the under electrodes 41, electric field is generated between the color changing layers 44 and the upper electrodes 42, allowing the luminescence of the organic luminescent medium 45 therebetween.

Like the third embodiment, since the width of the under electrodes 41 can be extremely narrower compared with that of the color changing layers 44, the under electrodes 41 can be made of fine metal wire through which light does not transmit.

Since fine metal wire with a low electric resistance is used in the under electrodes 41, luminous efficiency can be improved. As a result, there can be provided an organic EL display device with high luminous brightness and low power consumption.

Further, in the fourth embodiment, since the under electrodes 41 extend from the side of the color changing layers 44 onto the top surface thereof, the under electrodes 41 can closely contact the color changing layers 44, thereby obtaining an organic EL display device with higher reliability.

Fifth Embodiment

Figure 5A:
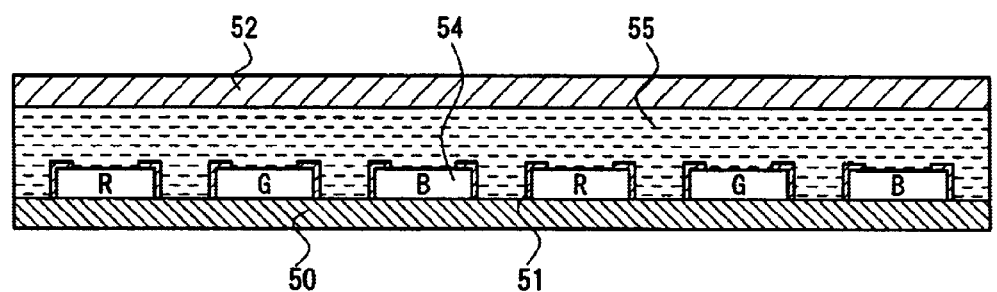
FIG. 5A is a sectional view of an organic EL display device according to a fifth embodiment of the present invention, illustrating the structure thereof.
Figure 5B:
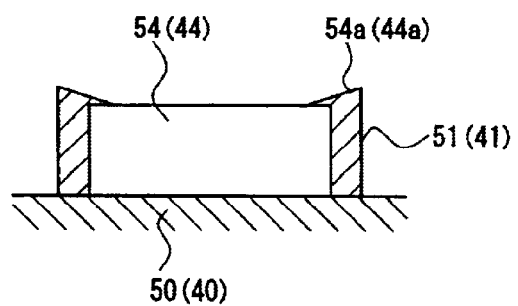
FIG. 5B is an enlarged sectional view of an under electrode and a color changing layer as shown in FIGS. 4 and 5A.

FIG. 5A is a sectional view of an organic EL display device according to a fifth embodiment of the present invention, illustrating the structure thereof. FIG. 5B is an enlarged sectional view of an under electrode and a color changing layer as shown in FIGS. 4 and 5A.

As shown in FIG. 5A, an organic EL display device of the embodiment comprises color changing layers 54 formed on a substrate 50, under electrodes 51 formed in close contact with a side of the color changing layers 54 so as to surround all or part of the side with a part of the electrodes 51 extending from the side onto the top surface of the color changing layers 54, upper electrodes 52 opposite to the under electrodes 51 and color changing layers 54, and an organic luminescent medium 55 formed between the upper electrodes 52 and color changing layers 54. The color changing layers 54 are made of a conductive material.

The R, G, B, color changing layers 54 are sequentially separately repeatedly formed substantially in a plane. The organic luminescent medium 55 is provided in contact with the layers 54.

According to the embodiment, since the under electrodes 51 are formed so as to surround all or part of a side of the color changing layers 54 with a part of the electrodes 51 extending from the side onto the top surface thereof, the under electrodes 51 can closely contact the color changing layers 54 more than the fourth embodiment. Thus, there can be obtained an organic EL display device with further higher reliability.

In the fourth and fifth embodiments, as shown in FIG. 5B, if the upper parts of the under electrodes 51 (41) are tapered to become thinner toward the center of the color changing layers 54 (44), differences in height between the under electrodes 51 (41) and the color changing layers 54 (44) can be removed to suppress the occurrence of display defects.

Under electrodes to be formed on a substrate may be those 41 of the fourth embodiment or those 51 of the fifth embodiment. Alternatively, these electrodes 41, 51 may be properly combined. For example, electrodes 41 of the fourth embodiment and electrodes 51 of the fifth embodiment may be alternately arranged in a striped pattern.

Sixth Embodiment

Figure 6:
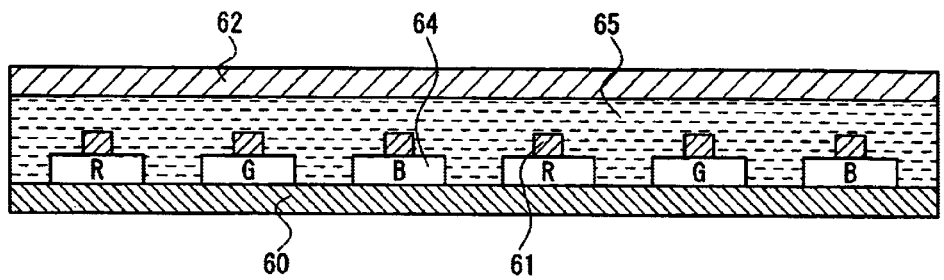
FIG. 6 is a sectional view of an organic EL display device according to a sixth embodiment of the present invention, illustrating the structure thereof.

FIG. 6 is a sectional view of an organic EL display device according to a sixth embodiment of the present invention, illustrating the structure thereof.

As shown in FIG. 6, an organic EL display device of the embodiment comprises three color, R, G, B, changing layers 64 formed on a substrate 60, upper electrodes 62, under electrodes 61 formed on the top surface of the color changing layers 64 so as to be opposite to the upper electrodes 62, and an organic luminescent medium 65 formed between the upper electrodes 62 and color changing layers 64.

The organic luminescent medium 65 is provided so as to cover the color changing layers 64 and under electrodes 61.

In the present invention, the color changing layers 64 are conductive so that electric field can be generated between the color changing layers 64 and the upper electrodes 62, thereby letting the organic luminescent medium 65 emit light. Thus, the under electrodes 61 can be formed such that its width is extremely narrow compared with the color changing layers 64.

Further, the under electrodes 61 can be placed at any position of the top surface of the color changing layers 64. Consequently, when forming the under electrodes 61 along the color changing layers 64, the positioning of the electrodes 61 is significantly facilitated with substantial savings in manufacturing costs.

Seventh Embodiment

Figure 7:
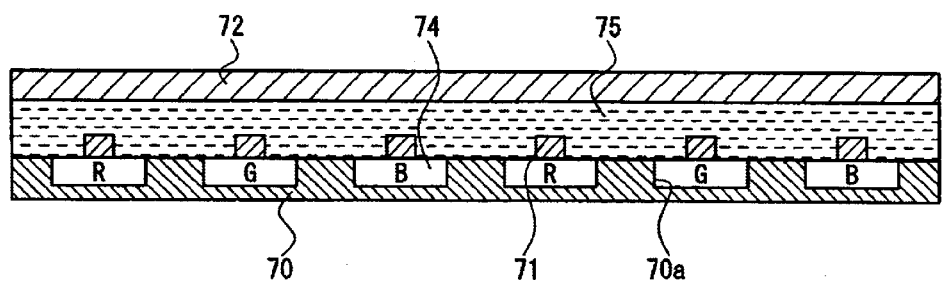
FIG. 7 is a sectional view of an organic EL display device according to a seventh embodiment of the present invention, illustrating the structure thereof.

FIG. 7 is a sectional view of an organic EL display device according to a seventh embodiment of the present invention, illustrating the structure thereof.

As shown in FIG. 7, an organic EL display device of the embodiment comprises substrate 70, concave parts 70a formed in the substrate 70 corresponding to pixel positions, three color, R, G, B, changing layers 74 inserted in the concave parts 70a, under electrodes 71 formed on the color changing layers 74, upper electrodes 72 opposed to the under electrodes 71, and an organic luminescent medium 75 formed between the upper electrodes 72 and color changing layers 74.

Like the sixth embodiment, the under electrodes 71 can be formed such that its width is extremely narrower compared with that of the color changing layers 74. Further, the under electrodes 71 can be placed at any position of the top surface of the color changing layers 74. Consequently, when forming the under electrodes 71 along the color changing layers 74, the positioning of the electrodes 71 is significantly facilitated with substantial savings in manufacturing costs.

In addition, since the color changing layers 74 enter in the concave parts 70a formed in the substrate 70, the thickness of the organic EL display device can be thinner.

Eighth Embodiment

Figure 8:
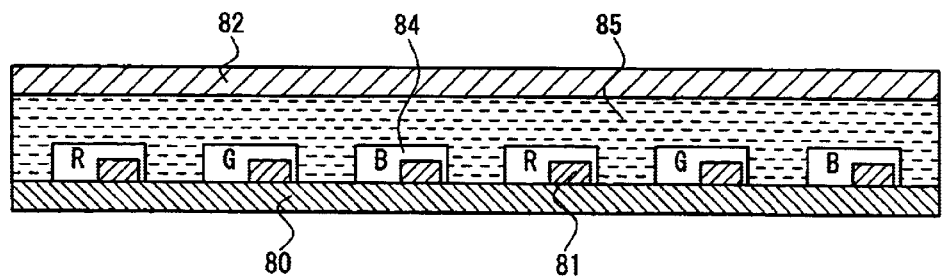
FIG. 8 is a sectional view of an organic EL display device according to an eighth embodiment of the present invention, illustrating the structure thereof.

FIG. 8 is a sectional view of an organic EL display device according to an eighth embodiment of the present invention, illustrating the structure thereof.

As shown in FIG. 8, an organic EL display device of the embodiment comprises under electrodes 81 formed on a substrate 80, three color, R, G, B, changing layers 84 placed around the under electrodes 81 so as to enclose them, upper electrodes 82 opposed to the under electrodes 81 and the color changing layers 84, and an organic luminescent medium 85 formed between the upper electrodes 82 and color changing layers 84. The color changing layers 84 are made of a conductive material.

Like the above embodiments, the under electrodes 81 can be formed such that its width is extremely narrower compared with that of the color changing layers 84. Further, the under electrodes 81 can be placed at any position inside the color changing layers 84. Consequently, the positioning of the color changing layers 84 and the under electrodes 81 is significantly facilitated. Further differences in height around the under electrodes 81 can be removed to suppress the occurrence of display defects. In addition, the covering of the under electrodes 81 with the color changing layers 84 can prevent damage of the electrodes 81.

Since the color changing layers 84 are interposed between the upper electrodes 82 and the under electrodes 81, the interference between the electrodes 81, 82 is weakened, thereby suppressing changes in chromaticity with changes in viewing angle.

Ninth Embodiment

Figure 9:
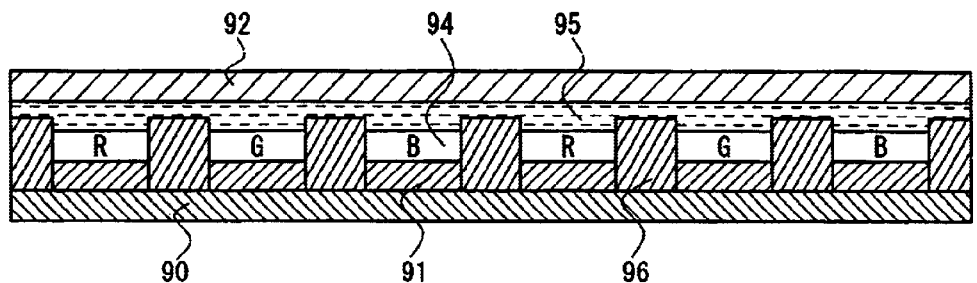
FIG. 9 is a sectional view of an organic EL display device according to a ninth embodiment of the present invention, illustrating the structure thereof.

FIG. 9 is a sectional view of an organic EL display device according to a ninth embodiment of the present invention, illustrating the structure thereof.

As shown in FIG. 9, an organic EL display device of the embodiment comprises under electrodes 91 formed on a substrate 90, three color, R, G, B, changing layers 94 formed on the under electrodes 91, upper electrodes 92 opposed to the under electrodes 91 and the color changing layers 94, and an organic luminescent medium 95 formed between the upper electrodes 92 and color changing layers 94. Shading layers 96 are provided between the color changing layers 94 to prevent color mixture caused by change in viewing angle. The color changing layers 94 are made of a conductive material.

In this embodiment, by the provision of the shading layers 96, color mixture is prevented and display images with high quality can be obtained.

Preferably, the thickness of the shading layers 96 is slightly larger than the total thickness of the color changing layers 94 and the under electrodes 91. Such thickness prevents light from inserting from adjacent color changing layers 94, thus allowing display with less color mixture and wider viewing angle.

Tenth Embodiment

Figure 10:
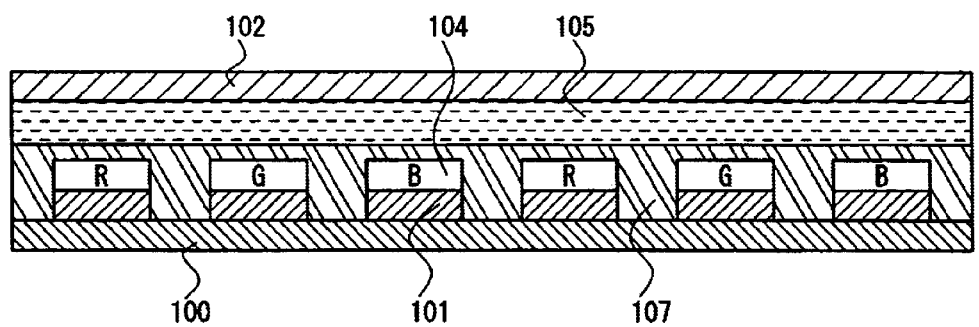
FIG. 10 is a sectional view of an organic EL display device according to a tenth embodiment of the present invention, illustrating the structure thereof.

FIG. 10 is a sectional view of an organic EL display device according to a tenth embodiment of the present invention, illustrating the structure thereof.

As shown in FIG. 10, an organic EL display device of the embodiment comprises under electrodes 101 formed on a substrate 100, three color, R, G, B, changing layers 104 formed on the under electrodes 101, upper electrodes 102 opposed to the under electrodes 101 and the color changing layers 104, and an organic luminescent medium 105 formed between the upper electrodes 102 and color changing layers 104. A carrier transport flattening layer 107 is formed over and around the color changing layers 104 to fill in projective, concave and convex parts of the layers 104 and grooves between the layers 104. The layers 104 are made of a conductive material.

In this embodiment, such uneven parts and grooves can be filled and flattened, thereby avoiding undesirable short-circuit between the color changing layers 104 and the upper electrodes 102. Further, since uneven parts are removed at the interface of the color changing layers 104 and the organic luminescent medium 105, the quality of display images can be enhanced.

In the above first to tenth embodiments, since the color changing layers 14 to 104 are made of conductive materials, they can be manufactured at pixel parts by using a micelle electrolytic method described later.

Eleventh Embodiment

Figure 11:
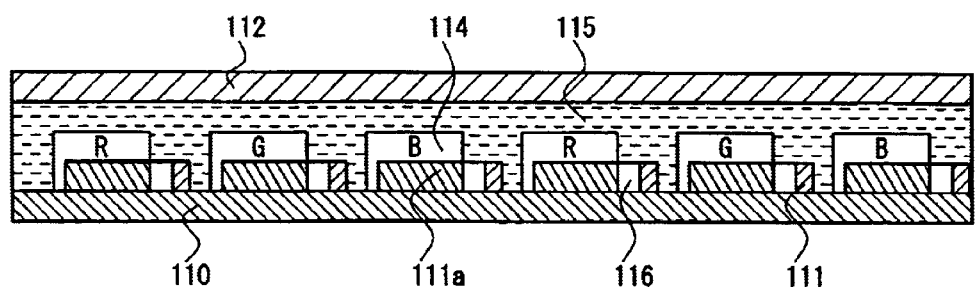
FIG. 11 is a sectional view of an organic EL display device according to an eleventh embodiment of the present invention, illustrating the structure thereof.

FIG. 11 is a sectional view of an organic EL display device according to an eleventh embodiment of the present invention, illustrating the structure thereof.

As shown in FIG. 11, an organic EL display device of the embodiment comprises under electrodes 111 formed on a substrate 110, three color, R, G, B, changing layers 114 formed on the substrate 110 spaced from the electrodes 111, upper electrodes 112 opposed to the under electrodes 111 and the color changing layers 114, an organic luminescent medium 115 formed between the upper electrodes 112 and color changing layers 114, and switching elements 116 capable of connecting the electrodes 111 to the layers 114 through electrode plates 111a. The layers 114 are made of a conductive material.

If the switching elements 116 are actuated electrically or mechanically to generate electric field between the color changing layers 114 and the upper electrodes 112, the organic luminescent medium 115 in contact with the layers 114 can emit light.

In this embodiment, since a voltage is applied to only desired color changing layers 114 by selectively actuating the switching elements 116, any crosstalk may not occur. Further, since the luminescent state can be maintained by using the switching elements 116, even if the number of the color changing layers 114 and scanning number in a display screen are increased, high luminous brightness can be maintained with high luminous efficiency. Thus, the device of this embodiment is particularly suitable for display screens of a large size.

In this embodiment, color changing layers 114 can be manufactured at desired parts by actuating certain switching elements 116 and then producing a potential difference in certain electrode plates 111a in a micelle electrolytic method described later.

Twelfth Embodiment

In the eleventh embodiment, the color changing layers 114 are connected to the under electrodes 111 via the switching elements 116.

Figure 12:
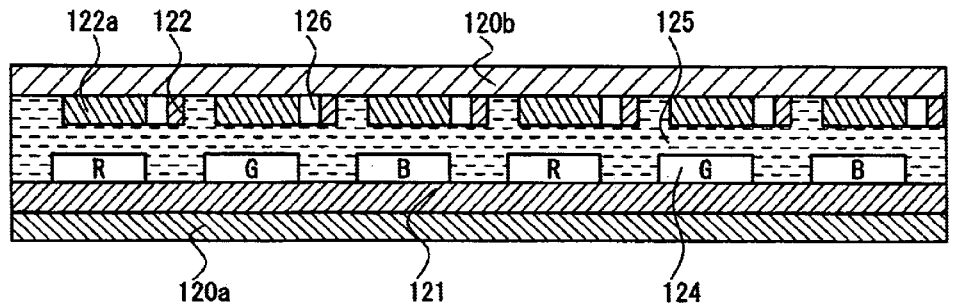
FIG. 12 is a sectional view of an organic EL display device according to a twelfth embodiment of the present invention, illustrating the structure thereof.

In the twelfth embodiment as shown in FIG. 12, switching elements 126 are provided adjacent upper electrodes 122.

That is to say, three color, R, G, B, changing layers 124 formed on under electrodes 121 above an under substrate 120a; and electrode plates 122a arranged just above the color changing layers 124 on an upper substrate 120b such that each plate 122a corresponds to each color changing layer 124. Upper electrodes 122 are placed spaced from the electrode plates 122a. The connection between the upper electrodes 122 and the electrode plates 122a is made or broken by the switching elements 126.

When the switching elements 126 are actuated to generate electric field between the color changing layers 124 and the electrode plates 122a, the organic luminescent medium 125 can emit light between the electrode plates 122a and color changing layers 124.

Like the above embodiment, color changing layers 124 can be manufactured at desired parts by actuating certain switching elements 126 in a micelle electrolytic method described later.

Thirteenth Embodiment

Figure 13:
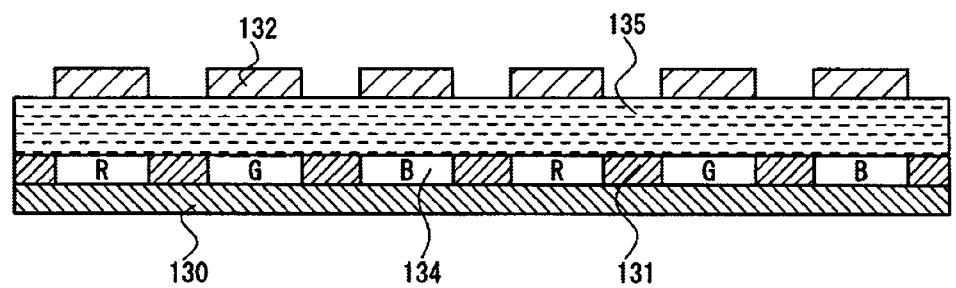
FIG. 13 is a sectional view of an organic EL display device according to a thirteenth embodiment of the present invention, illustrating the structure thereof.
Figure 14:
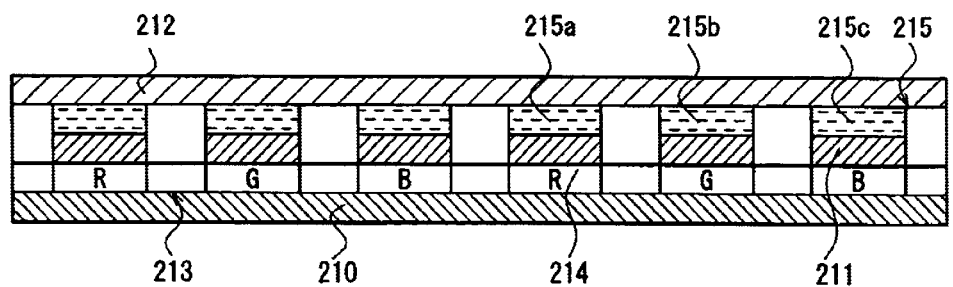
FIG. 14 is a sectional view of a conventional organic EL display device, illustrating the structure thereof.
Figure 15:
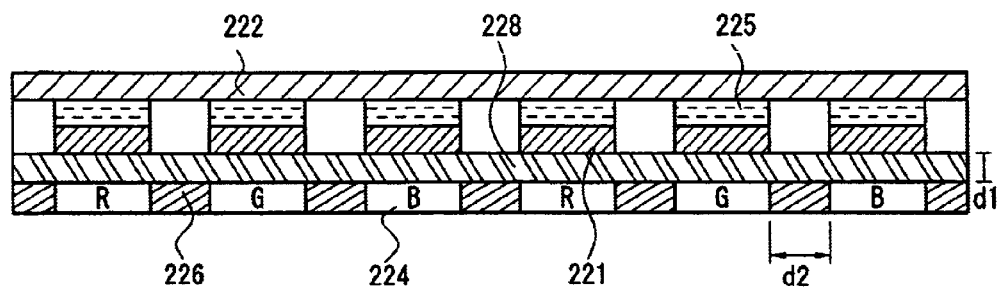
FIG. 15 is a sectional view of another conventional organic EL display device disclosed in WO98/34437, illustrating the structure thereof.

FIG. 13 is a sectional view of an organic EL display device according to a thirteenth embodiment of the present invention, illustrating the structure thereof.

In this embodiment, under electrodes 131 are arranged in contact with color changing layers 134 on the substantially same plane. The under electrodes 131 are made of the same materials as the color changing layers 134.

According to the embodiment, the under electrodes 131 can be manufactured in the same step of manufacturing the color changing layers 134. Thus, the number of steps for manufacturing the organic EL display device can be reduced in savings in manufacturing costs.

Although the color changing layers 14 to 134 are described as three colors, R, G, B, in the above first to thirteenth embodiments, the layers 14 to 134 are not limited to the colors. They may be combination of other colors or mono-color.

Although color changing layers and/or under electrodes are provided on or inside a substrate in the above first to thirteenth embodiments, a sealing layer, insulating layer, flattening layer or the like may be used instead of the substrate.

Method of Manufacturing Organic EL Display Device

The organic EL display devices of the present invention can be manufactured by forming conductive color changing layers 14 to 134 and under electrodes 11 to 131 such that the color changing layers 14 to 134 can be electrically connected to the under electrodes 11 to 131; forming an organic luminescent medium 15 to 135 above the color changing layers 14 to 134; and forming upper electrodes 12 to 132 to sandwich the organic luminescent medium 15 to 135 between the upper electrodes 12 to 132 and the color changing layers 14 to 134, a voltage being applied to the under and upper electrodes 11 to 131, 12 to 132.

The under and upper electrodes 11 to 131, 12 to 132 can be formed in patterns by an etching method described later. The contour of the color changing layers 14 to 134 can be similarly formed by the etching method.

In the case of forming the flattening layer 107 between the color changing layers 104 and the organic luminescent medium 105 as shown in FIG. 10, the layer 107 is preferably formed after the formation of the color changing layers 104. The thickness of the layer 107 is preferably from 0.5 $\mu$m to 20 $\mu$m, more preferably from 1 $\mu$m to 15 $\mu$m.

In the case of forming the switching elements 116, 126 between the under electrodes 111 and the color changing layers 114 or between the upper electrodes 122 and the color changing layers 124, the elements 116, 126 are preferably formed in the step of forming the under or upper electrodes 111, 122, respectively.

Explanation on Each Constituent Member

Next, each member constituting organic EL display devices as shown in the first to thirteenth embodiments will be described in detail.

1. Substrate

Light-transmitting substrates may be used as the substrate 10 to 130. Preferably, the substrates 10 to 130 can transmit 50% or more of light in a visible region of 400 to 700 nm. More preferably they are flat and smooth.

For example, as such light-transmitting substrate, glass substrates and synthetic resin substrates may be preferably used. Glass substrates include substrates made of soda-lime glass, barium/strontium-containing glass, lead glass, aluminosilicate glass, borosilicate glass, barium borosilicate glass, and quartz. Synthetic resin substrates include substrates made of polycarbonate resins, acryl resins, polyethyleneterephthalate resins, polyethersulfide resins and polysulfone resins.

2. Color Changing Layer

Color filters and/or fluorescent layer can be used as the conductive color changing layers 14 to 134 depending on the functions thereof.

Color filters pass light by decomposing or cutting light. As a result, the loss of light is relatively high. In the case where white luminescence is decomposed into three primary colors (R, G, B), brightness of white color may be disadvantageously reduced to about ⅓. However, they can improve the color purity by absorbing part of light emitted from the organic luminescent medium 15 to 135.

Fluorescent layers have a function of changing color, that is, absorbing light from the organic luminescent medium 15 to 135 and emitting different light by themselves. They absorb light and change it to fluorescence having a longer wavelength than that of the absorbed light. If the fluorescent layers absorb light at an absorptance ratio of 80% and they emit fluorescence at a fluorescent ratio of 80%, they can change light to another light of a longer wavelength at a ratio of 64%.

Further, since the fluorescent layers radiate fluorescence isotropically, the viewing angle is extended with higher visuality.

Thus, the fluorescent layers are more suitable for color changing layers of organic EL display devices.

However, in the case where it is required to enhance color purity and color contrast by preventing incident light from the outside, the above color filters are preferably used.

(1) Color Filter

Conductive color filters preferably comprise a pigment and a particulate conductive material for excellent durability and stable conductivity.

More preferably, a binder resin may be added to improve the mechanical strength of color filters.

(i) Pigment

Suitable pigments include;

red (R) pigments: perylene-based pigments, rake pigments, azo-based pigments, quinacridone-based pigments, anthraquinone-based pigments, anthracene-based pigments, isoindolin-based pigments, isoindolinone-based pigments and the like, and mixtures thereof;

green (G) pigments: polyhalogenated phthalocyanine-based pigments, polyhalogenated copper phthalocyanine-based pigments, triphenylmethane-based basic dyes, isoindolin-based pigments, isoindolinone-based pigments and the like, and mixtures thereof; and blue (B) pigments: copper phthalocyanine-based pigments, indanthrone-based pigments, indophenol-based pigments, cyanine-based pigments, dioxazine-based pigments and the like, and mixtures thereof.

(ii) Particulate Conductive Material

Particulate conductive materials include not be limited to tin oxide, zinc oxide, indium oxide, ITO (Indium Tin Oxide, indium oxide doped with tin oxide), oxides composed mainly of indium oxide and zinc oxide, carbon and metals such as aluminum, nickel and chromium.

Preferably conductive oxides which does not degrade the transparency nor the efficiency of taking out light may be used.

Tin oxide and ITO are particularly suitable since they are sufficiently dispersed in pigment to give good conductivity.

The diameter of these conductive materials is from 100 Å to 10 $\mu$m, preferably 500 Å to 2 $\mu$m. If it is smaller than 100 Å, the conductivity become significantly lower, whereas if it is larger than 2 $\mu$m, conductive materials may not be uniformly dispersed in pigment.

(iii) Binder Resin

In conductive color filters of another type, a binder is added to particulate conductive material and pigment. Such color filters have an improved mechanical strength enough to avoid to be formed with a higher yield of manufacturing organic EL display devices.

For binder resins, transparent materials having a transmittance over 50% are preferred. They include transparent resins (polymers) such as polymethylmethacrylate, polyacrylate, polycarbonate, polyvinylalcohol, polyvinylpyrrolidone, hydroxyethylcellulose, carboxymethylcellulose and the like.

In the case where a photolithography method is used to arrange color filters, photosensitive resins suitable for photolithography are preferably used. Such resins include photoresist materials with a reactive vinyl group such as acryl-based materials, methacryl-based materials, polyvinylcinnamic acid-based materials, and cyclic rubber-based materials.

In the case where a printing method is used to arrange color filters, transparent resins are preferably used. Transparent resins include polyvinylchloride resins, polychlorovinylidene resins, melamine resins, phenol resins, alkyd resins, epoxy resins, polyurethane resins, polyester resins, maleic acid resins, polyamide resins, polycarbonate, polyvinylalcohol, polyvinylpyrrolidone, hydroxyethylcellulose, and carboxymethylcellulose.

(2) Fluorescent Layer

Fluorescent layers suitable for the present invention will be explained.

Fluorescent layers preferably comprise a fluorescent pigment and a particulate conductive material for excellent durability and stable conductivity.

More preferably, a binder resin is added to improve the mechanical strength of fluorescent layers. Examples of fluorescent layers used as the conductive color changing layers 14 to 134 include;

(a) a fluorescent pigment and a particulate conductive material;

(b) a fluorescent pigment, a particulate conductive material and a binder resin; and (c) a particulate conductive material and a particulate solid material in which a fluorescent pigment is dissolved or dispersed in a pigment resin and/or a binder resin.

More preferable fluorescent layers include;

(d) conductive fluorescent layers in which a fluorescent material with a low or high molecular weight is dispersed in a semi-conductive electron transporting layer made of an electron transporting material and a reducing dopant.

(i) Fluorescent Pigment

Fluorescent Pigments used in conductive fluorescent layers will be explained.

Fluorescent pigments which change near-ultraviolet to violet luminescence of an organic EL element to blue luminescence include stilbene-based pigments such as 1,4-bis(2-methylstyryl)benzene and trans-4,4'-diphenylstilbene; coumarin-based pigments such as 7-hydroxy-4-methylcoumarin; and mixtures thereof.

Fluorescent pigments which change blue to blue green luminescence of an organic EL element to green luminescence include coumarin-based pigments such as 2,3,5,6-1H,4H-tetrahydro-8-trifluoromethylquinolizino(9,9a,1-gh)coumarin, 3-(2'-benzothiazolyl)-7-diethylaminocoumarin and 3-(2'-benzimidazolyl)-7-N,N-diethylaminocoumarin; naphthalimide-based pigments such as Basic Yellow 51, Solvent Yellow 11 and Solvent Yellow 116; and mixtures thereof.

Fluorescent pigments which change blue to green luminescence of an organic EL element to orange to red luminescence include cyanine-based pigments such as 4-dicyanomethylene-2-methyl-6-(p-dimethylaminostyryl)-4H-pyran; pyridine-based pigments such as 1-ethyl-2-(4-(p-dimethylaminophenyl)-1,3-butadienyl)-pyridinium-perchlorate; Rhodamine-based pigments such as Rhodamine B and Rhodamine 6G; oxazine-based pigments; and mixtures thereof.

In addition, various dyes (direct dyes, acidic dyes, basic dyes, dispersion dyes, or the like) which exhibit fluorescence can also be used.

The above-mentioned fluorescent pigments may be blended in a resin such as polymethacrylic acid ester, polyvinylchloride, vinylchloride-vinyl acetate co-polymer, an alkyd resin, an aromatic sulfonamide resin, an urea resin, a melamine resin and a benzoguanamine resin and then be grinded to fine particles.

These fluorescent pigments can be used alone or in combination. In particular, since the efficiency of changing to red luminescence is low, those pigments may be mixed to enhance the efficiency.

(ii) The above-mentioned particulate conductive materials and binders suitable for color filters may be similarly used in fluorescent layers.

(3) Formation of Color Filters

Examples of methods for forming color filters containing conductive particles include a pigment dispersion method, printing method, electrolytic deposition method and micelle electrolytic method.

A method of forming a color filter by a micelle electrolytic method disclosed in Japanese Laid-open No. H7(1995)-128519 and the like, which method will be explained below. Color filters formed by the micelle electrolytic method have the higher content of pigments and excellent durability.

(i) Micelle Electrolytic Method

In the micelle electrolytic method, an above-mentioned pigment or dye subjected to a hydrophobic treatment and conductive particles are dispersed in an aqueous medium by a surfactant (micelle forming agent) containing a ferrocene derivative to produce a micelle disperse solution. An insulative board with a conductive thin film thereon is entered into the solution and then energized to micelle electrolysis. That is, micelles are broken to release pigment and the like enclosed therein. The pigment is deposited on the conductive thin film of the insulative board to form a desired thin film (conductive color filters).

Suitable aqueous mediums include water, mixtures of water and alcohol, mixtures of water and acetone and the like. For example, the following ferrocene surfactants may be used.

Micelle forming agent: Ferrocene derivative surfactants

Ether type (FPEG):

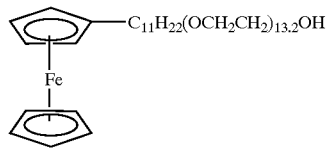

Ester type (FEST):

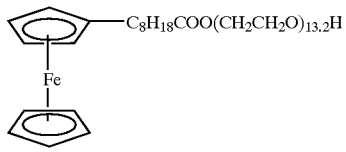

Ammonium type (FTMA):

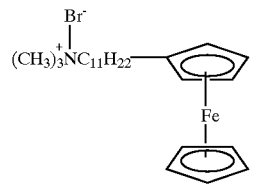

Other ferrocene derivatives can be used which are made in ways described in WO89/0193, Japanese Patent Laid-open Nos. H1(1989)-45370, H1(1989)-226894, H2(1990)-83387, H2(1990)-250892 and the like.

One or two or more of ferrocene derivatives can be used as a surfactant (micelle forming agent). Alternatively, ferrocene derivatives can be used in combination with other surfactants. Example of the other surfactants include non-ionic surfactants such as polyoxyethylenealkyl ether, polyoxyethylene fatty acid ester, polyoxyethylenealkylphenyl ether and polyoxyethylenepolyoxypropylenealkyl ether; and cationic and anionic surfactants such us alkyl sulfate, polyoxyethylenealkyl ether sulfate, alkyltrimethylammonium chloride and fatty acid diethylaminoethylamide.

A ferrocene derivative, if necessary, another surfactant, a desired pigment (dye) and conductive particles are added in an aqueous medium. The mixture is sufficiently agitated with a mechanical homogenizer, ultrasonic homogenizer, ball mill, sand mill, stirrer and the like.

In the case of using ultrasonic wave, the application condition is preferably set to 5 hour/little or less. In the case of using centrifugation, the centrifugal condition is preferably set to 4 G or less. In the process, the pigment is uniformly dispersed in the aqueous medium or forms micelles by the action of a surfactant to obtain a disperse or micelle solution. Although the concentration of the micelle forming agent is not limited, the total concentration of a ferrocene derivative and another surfactant is higher than critical micelle concentration, preferably 0.1 mmol/little to 1 mmol/little. The concentration of pigment or dye is generally from 1 g/little to 500 g/little.

In order to adjust the electric conductivity of the aqueous medium, if necessary, a supporting salt (supporting electrolyte) may be added. The supporting salt can be added in any amount where the deposition of dispersed pigment onto an electrode is not prevented. The addition amount thereof is generally from 0.05 to 10 mol/little. However, the supporting salt is not essential for electrolysis. In the case where a supporting salt is not used, a thin film (pigment film) of higher purity without a supporting salt can be formed. In the case where a supporting salt is used, the kind of the salt is not limited as far as it does not prevent the deposition of pigment on an electrode nor the formation of micelles, and can adjust the electric conductivity of an aqueous medium. Specifically, supporting salts include sulfates (salts of lithium, potassium, sodium, rubidium, aluminum and the like), acetates (salts of lithium, potassium, sodium, rubidium, beryllium, magnesium, calcium, strontium, barium, aluminum and the like) and ammonium salts. Concrete examples are LiBr, KCl, $Li_2SO_4$, $(NH_4)BF_4$ and the like. Such a supporting salt is preferably filtered with a filter of 0.5 $\mu$m or less.

In the above way, micelle disperse solutions can be prepared where a red pigment (dye), green pigment (dye) and blue pigment (dye) are dispersed, respectively. In the case where two or more of pigments are dispersed, all the pigments may be added to an aqueous medium at one time. Alternatively, each of the pigments may be added to an aqueous medium to obtain each micelle solution and then all the micelle solutions may be mixed.

Electrolysis conditions can be properly selected. Generally a solution temperature is 0 to 90° C., preferably 10 to 70° C. A voltage is 0.03 to 1.5 V, preferably 0.1 to 0.9 V. A current density is generally 10 $MA/cm^2$ or less, preferably 50 to 300 $\mu A/cm^2$.

In the electrolysis process, reaction proceeds according to the principle of the micelle electrolysis. In an anode, $Fe^{2+}$ of a ferrocene derivative is changed to $Fe^{3+}$ and micelles are broken so that pigment or dye is deposited on the anode.

On the other hand, in a cathode, $Fe^{3+}$, which has been oxidized in the anode, is reduced to $Fe^{2+}$, thereby allowing the formation of micelles. Thus films can be repeatedly formed in the same solution. The thickness and transmittance of each pigment film (layer) can be controlled by changing an electrolysis time in the above range of voltage.

Next, the thin films thus formed by micelle electrolysis are usually washed with purified water and the like and then air-dried at room temperature. If necessary, they may be subjected to a heat treatment of up to 200° C. By selectively applying a voltage to under electrodes, conductive color filters of a desired color can be formed on the selected electrodes.

Certain electrodes to be deposited can be selected by using electric switches previously mounted on a substrate. The switches may be made of various semiconductors such as crystalline silicone, polycrystalline silicone and amorphous silicone. They can be used not only for designing positions where color filters should be formed, but also for selecting pixels which should emit light after the manufacture of a display device.

(ii) Transparent Photo-Curing Resist

Derivatives of acrylic acid and methacrylic acid and copolymers thereof can be used as transparent photo-curing resist.

Transparent photo-curing resist is applied on all the surface of a substrate by a roll coat method, spin coat method, offset print method or the like. The resist is then subjected to a patterning treatment by photolithography to remain on parts where pigment layers of plural colors are not formed prior to or during the formation of the pigment layers. The patterned resist is heated at 150 to 300° C. in an oven or on a hot plate for curing to form protect films.

(iii) Transparent Thermosetting Resin

Derivatives of acrylic acid and methacrylic acid and copolymers thereof can be used as a transparent thermosetting resin.

A transparent thermosetting resin is applied on parts where pigment layers of plural colors are not formed prior to or during the formation of the pigment layers by a roll coat method, offset print method or the like. The resin is heated at 150 to 300° C. in an oven or on a hot plate for curing to form insulative films.

3. Electrodes and Organic Luminescent Medium

First and second electrodes can be an anode or a cathode depending on the structure of an organic EL display device. Organic luminescent medium is made of a positive hole transport layer, organic luminescent medium, electron transporting layer and the like. The organic luminescent medium may be mono-layer or a laminate of multi-layers.

Examples of structures of electrodes and organic luminescent medium are as follows:

(i) anode, organic luminescent medium, cathode
(ii) anode, positive hole transport layer, organic luminescent medium, electron transporting layer, cathode
(iii) anode, positive hole transport layer, organic luminescent medium, cathode
(iv) anode, organic luminescent medium, electron transporting layer, cathode In the present invention, conductive color changing layers are placed between an anode and a cathode, preferably in contact with an anode or a cathode. The electron transport flattening layer of Ninth embodiment functions as an electron transporting layer. The organic luminescent medium in the present invention means the entire structure described above between an anode and a cathode.

(1) Electrodes

Electrodes from which light is taken out are transparent. Such transparent electrodes may be made of only indium oxide and zinc oxide, or these oxides containing a doping metal at an atomic ratio of 0.2 or less. Doped metals include tin, aluminum, antimony, gallium and selenium. If a doped metal is added to indium and zinc oxides in the step of mixing materials, transparent electrodes mainly made of indium oxide and zinc oxide with the doped metal can be obtained.

For the composition of the transparent electrodes thus obtained, the atomic ratio of In and Zn, [In/(In+Zn)] is 0.2 to 0.9, preferably 0.5 to 0.9. The thickness thereof is 200 to 6000 Å, preferably 600 to 2000 Å.

Amorphous oxide transparent electrodes mainly made of indium oxide and zinc oxide can be formed by means of various sputtering methods with certain sputtering targets or an ion plating method. Such sputtering methods include a DC (direct current) sputtering method, RF (radio frequency) sputtering method, DC magnetron sputtering method, RF magnetron sputtering method, ECR (electron cyclotro resonance) plasma sputtering method, ion beam sputtering method, and the like.

An anode plays the role of injecting positive holes into a positive hole transport layer and luminescent layer. It effectively acts with a work function of 4.5 eV or more. Other materials suitable for an anode include indium tin oxide (ITO), tin oxide (NESA), gold, silver, platinum and copper. A cathode is preferably made of materials with a lower work function in order to inject electrons into an electron transporting layer or luminescent layer. Materials suitable for the cathode include not limited to indium, aluminum, magnesium, magnesium-indium alloys, magnesium-aluminum alloys, aluminum-lithium alloys, aluminum-scandium-lithium alloys and magnesium-silver alloys.

A usual etching process can be performed for the formation of the electrodes. Namely, resist is coated on the surface of a transparent electrode film, exposed with a mask positioned thereon, developed with an organic solvent, etched with an acidic solution or gas such as CHF and removed, thereby forming a certain pattern.

(2) Organic Luminescent Medium

Materials for an electron transporting layer (electron injecting layer) are not limited and any compounds which are usually used as an electron transporting material can be used. For example, oxadiazole derivatives such as 2-(4-biphenylyl)-5-(4-t-butylphenyl)-1,3,4-oxadiazole, bis{2-(4-t-butylphenyl)-1,3,4-oxadiazole}-m-phenylene, triazole derivatives, and quinolinol type metal complexes can be used. Insulative or semiconductive materials are preferably used as an inorganic compound constituting an electron transporting layer. If an electron transporting layer is made of insulative or semiconductive materials, leak of current can be effectively prevented to enhance the electron injecting property. A metallic compound selected from the group of chalcogenides and halides of alkali metals and alkaline-earth metals is preferably used as an insulative material. If an electron transporting layer is made of these compounds, the electron injecting property is further enhanced.

Specifically, suitable chalcogenides of alkali metals include $Li_2O$, LiO, $Na_2S$, $Na_2Se$ and NaO. Suitable chalcogenides of alkaline-earth metals include CaO, BaO, SrO, BeO, BaS and CaSe. Suitable halides of alkali metals include LiF, NaF, KF, LiCl, KCl and NaCl. Suitable halides of alkaline-earth metals include fluorides such as $CaF_2$, $BaF_2$, $SrF_2$, $MgF_2$ and $BeF_2$ and halides other than fluorides.

Semiconductive materials constituting an electron transporting layer include one or combinations of oxides, nitrides, and oxidized nitrides containing at least one element selected from the group of Ba, Ca, Sr, Yb, Al, Ga, In, Li, Na, Cd, Mg, Si, Ta, Sb and Zn.

Fine crystalline or amorphous insulative thin films are more preferably used as an inorganic compound of an electron transporting layer. If the electron transporting layer is made of such insulative thin films, more uniform thin film can be formed, thereby reducing pixel defectives such as dark spots.

Examples of these inorganic compounds include the above-mentioned chalcogenides and halides of alkali metals and alkaline-earth metals.

Further the electron transporting layer may contain a reducing dopant with a work function of 2.9 eV or less. The reducing dopant means materials capable of reducing electron transporting compounds. Thus, any compounds which has a certain reducing ability may be used. For example, preferred compounds include at least one material selected from the group consisting of alkali metals, alkaline-earth metals, rare-earth metals, oxides of alkali metals, halides of alkali metals, oxides of alkaline-earth metals, halides of alkaline-earth metals, oxides of rare-earth metals, halides of rare-earth metals, organic complexes of alkali metals, organic complexes of alkaline-earth metals and organic complexes of rare-earth metals.

Specifically, suitable reducing dopants include at least one alkali metal selected from the group of Na (work function: 2.36 eV), K (work function: 2.28 eV), Rb (work function: 2.16 eV) and Cs (work function: 1.95 eV) and at least one alkaline-earth metal selected from the group of Ca (work function: 2.9 eV), Sr (work function: 2.0 to 2.5 eV) and Ba (work function: 2.52 eV). Dopants with a work function of 2.9 eV or less are more preferred.

Among the above dopants, more preferred dopants are at least one alkali metal selected from the group of K, Rb and Cs, still more preferably Rb or Cs, most preferably Cs. These alkali metals have a particularly higher reducing ability. The addition thereof into an electron injection area at a relatively little amount allows higher luminous brightness and longer durability of the organic luminescent medium.

In order to obtain a reducing dopant with a work function of 2.9 eV or less, two or more of the above alkali metals may be combined. Combinations with Cs are particularly preferred, for example, Cs and Na; Cs and K; Cs and Rb; and Cs, Na and K. The combinations with Cs remarkably enhance the reducing ability. As a result, the addition thereof into an electron injection area allows higher luminous brightness and longer durability of the organic luminescent medium.

For organic luminescent medium and positive hole transport layer, they are described in U.S. Ser. No. 09/147,104, which is entirely incorporated by reference.

In the present invention, methods for forming each layer of an organic luminescent medium and electrodes are not limited. Any methods such as a known vacuum deposition method and spin coating can be used. Organic thin film layers used in an organic luminescent medium and electrodes can be formed by known methods such as a vacuum deposition method, molecular beam deposition (MBE) method, dipping method, spin coating method, casting method, bar coat method, roll coat method.

The thickness of the above organic thin film layers is not limited. However, if the thickness is too thin, defectives such as pin holes may occur, whereas if it is too thick, the application of a higher voltage is required, reducing the efficiency. Thus, it is preferably in the range of several nm to 1 $\mu$m.

EXAMPLES

Reference Example 1

In Reference Example 1, a disperse solution of conductive particles was prepared for micelle electrolysis.

To 15 kg of purified water were added 1500 g of conductive tin oxide particles whose surfaces had been subjected to a hydrophobic treatment with a silane-based coupling agent and 74.25 g of a ferrocene surfactant (10-ferrocenyldecanoylpolyoxyethylene). The mixture was subjected to a dispersing treatment with a ultrasonic homogenizer for 12 hours while it was cooled to maintain the temperature of the disperse solution about 18° C. The resultant solution was diluted by twice with a 0.4 wt. % aqueous solution of the above ferrocene surfactant. Then 225 g of a chelate-type ion exchange resin conditioned to lithium type was added thereto, followed by agitation at 25° C. for 12 hours. Further 450 g of sepabeads SP207 (polystyrene-type, Wako Jyunyaki Co.) was added thereto, followed by agitation at 25° C. for 12 hours. Next, it was centrifuged with a continuous centrifugal separator under conditions, 1500 rotations per minute (rpm), a flow amount of 300 mililittle/minute and 25° C. To the recovered solution was added lithium bromide at a ratio of 1.05 g of lithium bromide to 1 kg of the solution. The mixture was agitated for 30 minutes to obtain the titled disperse solution of conductive tin oxide.

Reference Example 2

In Reference Example 2, a red pigment disperse solution containing conductive tin oxide was prepared.

To 15 kg of purified water were added 339.45 g of dianthracequinonyl•red (Chiba Specialty Chemicals Co.), 56.25 g of a ferrocene surfactant (10-ferrocenyldecanoylpolyoxyethylene) and 15.75 g of lithium bromide. The mixture was subjected to a dispersing treatment with a ultrasonic homogenizer for 12 hours while it was cooled to maintain the temperature of the disperse solution above 18° C. The resultant solution was centrifuged with a continuous centrifugal separator under conditions, 1000 rpm, a flow amount of 200 mililittle/minute and 25° C. to obtain a red pigment disperse solution. The red pigment disperse solution was mixed with the disperse solution of conductive tin oxide prepared in Reference Example 1 at a ratio of 50:50 by weight to obtain the titled red pigment disperse solution containing conductive tin oxide.

Reference Example 3

In Reference Example 3, a green pigment disperse solution containing conductive tin oxide was prepared.

A green pigment disperse solution was prepared in the same manner as Reference Example 1 except that halogenated copper phthalocyanine (Dai Nippon Ink Chemical Co.) was used instead of conductive tin oxide; the amount of the ferrocene surfactant (10-ferrocenyldecanoylpolyoxyethylene) was changed to 299.25 g, the ion exchange resin treatment was not conducted, and the solution was diluted with the 0.4 wt. % aqueous solution by 4.27 times.

The green pigment disperse solution was mixed with the disperse solution of conductive tin oxide prepared in Reference Example 1 at a ratio of 45:55 by weight to obtain the titled green pigment disperse solution containing conductive tin oxide.

Reference Example 4

In Reference Example 4, a blue pigment disperse solution containing conductive tin oxide was prepared.

To 15 kg of purified water were added 1500 g of copper phthalocyanine (Dai Nippon Ink Chemical Co.), 306 g of the ferrocene surfactant (10-ferrocenyldecanoylpolyoxyethylene) and 15.75 g of lithium bromide. The mixture was subjected to a dispersing treatment with a ultrasonic homogenizer for 12 hours while it was cooled to maintain the temperature of the disperse solution about 18° C. The resultant solution was centrifuged with a continuous centrifugal separator under conditions, 10000 rpm, a flow amount of 200 mililittle/minute and 25° C. The recovered solution was diluted with a 0.3 wt. % aqueous solution of the ferrocene surfactant by 4.85 times. The diluted solution was then agitated at 25° C. for 12 hours to obtain a blue pigment disperse solution.

The blue pigment disperse solution was mixed with the disperse solution of conductive tin oxide prepared in Reference Example 1 at a ratio of 50:50 by weight to obtain the titled blue pigment disperse solution containing conductive tin oxide.

Example

ITO transparent electrodes were formed on a glass substrate as under electrodes in a striped pattern with an electrode width of 90 μm and a distance between electrodes of 20 μm. The number of stripes was 960. The stripe-like electrodes were divided into combinations which each include three electrodes A, B and C in this order. The substrate with the stripe-like electrodes was then immersed in the red disperse solution containing conductive tin oxide of Reference Example 2. A voltage of +0.5 V was applied for 15 minutes to the electrodes A while using a stainless steel plate as an anode with a reference potential by a saturated calomel electrode. Thereafter, the resultant substrate was removed from the red disperse solution, followed by washing with purified water to obtain a substrate with conductive thin films of a red pigment on the electrodes A. The substrate was subjected to a baking process in an oven at 150° C. for 30 minutes.

Next, the substrate was immersed in the green disperse solution containing conductive tin oxide of Reference Example 3. The same processes were conducted for the electrodes B. Further, the substrate was immersed in the blue disperse solution containing conductive tin oxide of Reference Example 4. The same processes were conducted for the electrodes C. As a result, red, green, blue conductive color filters were formed on the electrodes A, B and C, respectively, which constituted color changing layers.

A white organic luminescent medium and opposing electrodes were formed on the color changing layers as shown below. The element thus obtained was subjected to ultrasonic washing in isopropylalcohol for one minute and UV ozone washing for three minutes.

The substrate with the color changing layers was mounted to a substrate holder in a vacuum deposition device. Next, a layer of N,N'-bis(N,N'-diphenyl-4-aminophenyl)-N,N'-diphenyl-4,4'-diamino-1,1'-biphenyl (hereinafter referred to as "TPD 232 film") was formed in a thickness of 160 nm so as to cover the color changing layers. The TPD 232 film acts as a positive hole injecting layer. Then, a layer of 4,4'-bis[N-(1-naphtyl)-N-phenylamino]biphenyl (hereinafter referred to as "NPD film") was formed in a thickness of 20 nm on the TPD 232 film. The NPD film acts as a positive hole transporting layer. Then, a distylyl compounds, DPVDPAN, of the following formula was deposited on the NPD film to form a film with a thickness of 40 nm.

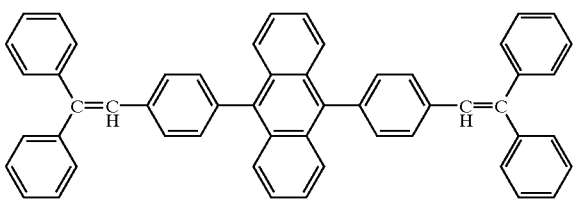

At this time, rubrene of a yellow luminescent dopant was added to DPVDPAN in an amount of 0.1 wt. %. This film acts as a white luminescent layer. A tris(8-quinolinol) aluminum film (hereinafter referred to as "Alq film") with a thickness of 20 nm was formed thereon. The Alq film acts as an electron transporting layer.

Next, Alq and Li (Li source: made by Saes Getters Company) of a reducing dopant were deposited to form an Alq:Li film as an electron transporting layer.

A metal aluminum was deposited on the Alq:Li film to form a cathode (upper electrodes). The number of the upper electrodes was 240. They were in a striped pattern so as to be perpendicular to the ITO electrodes. The width thereof was 300 μm and a pitch between electrodes was 330 μm.

A sealing lid was formed to cover the laminate from the under electrodes to the upper electrodes, thereby obtaining an organic EL display device. The stripe-like under electrodes and upper electrodes were connected to a driving circuit, allowing simple matrix driving by using the under electrodes as scanning lines and the upper electrodes as signal lines. As a result, color display could be obtained. It was checked for changes in chromaticity of white display by changing a viewing angle. When the angle was changed from 0 degree to 80 degrees against a line normal to a display screen, the change of chromaticity was 0.02 or less.

Comparative Example

As a comparative example was manufactured an organic EL display device in which non-conductive color changing layers were arranged outside opposing electrodes.

On a glass substrate (Corning 7059, 100 mm×100 mm×1.1 mm thickness) as a supporting substrate, an acrylate-based photo-curing resist V259PA (available from Nippon Steel Chem. Co.), in which 30 wt. % (on a solid basis) carbon black was dispersed, was spin-coated and baked at 80° C.

Thereafter, the resist film was exposed at 300 mJ/cm$^2$ (365 nm) by an exposing machine having a light source of a high-pressure mercury lamp via a mask to obtain a desired pattern. Next, development was carried out using a 1 wt. % aqueous solution of sodium carbonate for 2 minutes at room temperature, followed by baking at 200° C. to form patterned shading layers. The thickness of the shading layers was 2 μm.

Then an acrylate-based photo-curing resist V259PA (available from Nippon Steel Chem. Co., 70 wt. % on a solid basis) in which 28 wt. % (on a solid basis) of a copper phthalocyanine-based pigment (C.I. Pigment Blue 15:6) and 2 wt. % (on a solid basis) of a dioxazine-based pigment (C.I. Pigment Violet 23) were dispersed, was spin-coated and baked at 80° C. A mask was positioned so as to match the pattern of the shading layers.

Thereafter, the resist film was exposed at 300 mJ/cm$^2$ (365 nm) by an exposing machine having a light source of a high-pressure mercury lamp. Next, development was carried out using a 1 wt. % aqueous solution of sodium carbonate for 2 minutes at room temperature, followed by baking at 200° C. to form patterned blue filters. The thickness of the blue filters was 2 μm.

Then an acrylate-based photo-curing resist V259PA (available from Nippon Steel Chem. Co., 70 wt. % on a solid basis) in which 23 wt. % (on a solid basis) of a halogenated copper phthalocyanine-based pigment (C.I. Pigment Green 36) and 7 wt. % (on a solid basis) of an azo-based pigment (C.I. Pigment Yellow 83) were dispersed, was spin-coated and baked at 80° C. A mask was positioned so as to obtain a desired pattern.

Thereafter, the resist film was exposed at 300 mJ/cm$^2$ (365 nm) by an exposing machine having a light source of a high-pressure mercury lamp. Next, development was carried out using a 1 wt. % aqueous solution of sodium carbonate for 2 minutes at room temperature, followed by baking at 200° C. to form patterned green filters. The thickness of the green filters was 2 μm.

Then an acrylate-based photo-curing resist V259PA (available from Nippon Steel Chem. Co., 70 wt. % on a solid basis) in which 24 wt. % (on a solid basis) of an anthraquinone-based pigment (C.I. Pigment red 177) and 6 wt. % (on a solid basis) of an azo-based pigment (C.I. Pigment Yellow 6) were dispersed, was spin-coated and baked at 80° C. A mask was positioned so as to obtain a desired pattern.

Thereafter, the resist film was exposed at 300 mJ/cm$^2$ (365 nm) by an exposing machine having a light source of a high-pressure mercury lamp. Next, development was carried out using a 1 wt. % aqueous solution of sodium carbonate for 2 minutes at room temperature, followed by baking at 200° C. to form patterned red filters. The thickness of the red filters was 2 μm.

The shading layers and color changing layers (color filters) were separatively arranged on the substrate in the above way. The number of each R, G, B color filters was 320 and the width thereof was 90 μm. An acrylate-based photo-curing resist (Nippon Steel Chem. Co., V259PA) was spin-coated on the resultant substrate as a transparent medium. It was baked at 80° C. and further 180° C. The thickness of the transparent medium was about 10 μm.

Next, an ITO transparent electrodes were formed as under electrodes in a striped pattern with a width of 90 μm and a distance between electrodes of 20 μm. The number of stripes was 960. The under electrodes were positioned so as to be perpendicular to the color filters.

Further, like Example, an organic EL display device was manufactured. The stripe-like under electrodes and upper electrodes were connected to a driving circuit, allowing simple matrix driving by using the under electrodes as scanning lines and the upper electrodes as signal lines. As a result, color display could be obtained. It was checked for changes in chromaticity of white display by changing a viewing angle. When the angle was changed from 0 degree to 80 degrees against a line normal to a display screen, the change of chromaticity was as large as 0.08. Such change in R, G, B chromaticity was caused by interference.

As stated above, in the organic EL display device of the present invention, the color changing layers were placed between opposing electrodes to lessen interference therebetween, thus suppressing changes in chromaticity.

The invention is based on Japanese Patent Application No. 2000-360894, which is herein incorporated by reference.

It is to be understood by those skilled in the art that the forgoing description relates to preferred embodiments of the invention and that various changes and modifications may be made in the invention without departing from the spirit and scope thereof. Also it is to be understood that the invention is not limited to the embodiments thereof except as defined in the appended claims.

What is claimed is:

1. An organic EL display device comprising:
    first electrodes and second electrodes which a voltage is applied to;
    conductive color changing layers capable of being electrically connected to the first electrodes; and
    an organic luminescent medium placed between the second electrodes and the color changing layers.

2. The organic EL display device of claim 1, wherein the color changing layers are in contact with the organic luminescent medium.

3. The organic EL display device of claim 1, further comprising a carrier transport flattening layer between the color changing layers and the organic luminescent medium.

4. The organic EL display device of claim 1, wherein the first electrodes comprises a material constituting the color changing layers.

5. The organic EL display device of claim 1, wherein the first electrodes, the color changing layers, the organic luminescent medium and the second electrodes are placed in this order, and width of the color changing layers is substantially same as width of the first electrodes.

6. The organic EL display device of claim 1, wherein the first electrodes contact the color changing layers, and the first electrodes are narrower than the color changing layers.

7. The organic EL display device of claim 6, wherein the first electrodes are placed between the color changing layers and the organic luminescent medium.

8. The organic EL display device of claim 6, wherein the first electrodes are placed inside the color changing layers.

9. The organic EL display device of claim 6, wherein the first electrodes are placed substantially on a plane where the color changing layers are arranged.

10. The organic EL display device of claim 1, further comprising shading layers between the color changing layers.

11. The organic EL display device of claim 1, wherein the color changing layers comprise a color filter, a fluorescent layer or combination thereof.

12. The organic EL display device of claim 11, wherein the color filter comprises a pigment and a particulate conductive material, and the fluorescent layer comprises a fluorescent pigment and a particulate conductive material.

13. The organic EL display device of claim 12, wherein the particulate conductive material comprises a conductive oxide.

14. The organic EL display device of claim 1, wherein the device further comprises switching elements between the color changing layers and the first electrodes, and certain part of the organic luminescent medium can emit light by selectively actuating the switching elements.

15. The organic EL display device of claim 1, wherein the device further comprises electrode plates opposed to the color changing layers and switching elements between the second electrodes and the electrode plates, and certain part of the organic luminescent medium can emit light by selectively actuating the switching elements.

* * * * *

UNITED STATES PATENT AND TRADEMARK OFFICE
CERTIFICATE OF CORRECTION

PATENT NO. : 6,747,405 B2
DATED : June 8, 2004
INVENTOR(S) : Chishio Hosokawa

It is certified that error appears in the above-identified patent and that said Letters Patent is hereby corrected as shown below:

Title page,
Item [73], Assignee, change "Demitsu Kosan Co., Ltd." to -- Idemitsu Kosan Co., Ltd. --.

Signed and Sealed this

Eighth Day of February, 2005

JON W. DUDAS
*Director of the United States Patent and Trademark Office*